United States Patent
Sonalkar et al.

(10) Patent No.: US 6,356,569 B1
(45) Date of Patent: *Mar. 12, 2002

(54) DIGITAL CHANNELIZER WITH ARBITRARY OUTPUT SAMPLING FREQUENCY

(75) Inventors: Ranjan V. Sonalkar, North Caldwell; Howard David Helms, Brookside, both of NJ (US)

(73) Assignee: AT&T Corp, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/001,581

(22) Filed: Dec. 31, 1997

(51) Int. Cl.[7] .............................. H04J 3/22; G06F 15/00; G06F 17/14
(52) U.S. Cl. ................. 370/545; 370/210; 370/343; 708/313; 708/400; 708/405
(58) Field of Search .................... 370/210, 343, 370/344, 480, 545; 375/229, 260, 354, 377; 708/313, 400, 405

(56) References Cited

U.S. PATENT DOCUMENTS

| | | |
|---|---|---|
| 4,456,925 A | 6/1984 | Skerlos et al. |
| 4,620,289 A | 10/1986 | Chauvel |
| 4,725,694 A | 2/1988 | Auer et al. |
| 4,916,441 A | 4/1990 | Gombrich |
| 5,014,267 A | 5/1991 | Thompkins et al . |
| 5,157,717 A | 10/1992 | Hitchcock |
| 5,335,276 A | 8/1994 | Thompson et al. |
| 5,393,964 A | 2/1995 | Hamilton et al. |
| 5,406,615 A | 4/1995 | Miller, II et al. |
| 5,488,412 A | 1/1996 | Majeti et al. |
| 5,512,935 A | 4/1996 | Majeti et al. |
| 5,534,913 A | 7/1996 | Majeti et al. |
| 5,537,435 A * | 7/1996 | Carney et al. ............... 375/435 |
| 5,546,316 A | 8/1996 | Buckley et al. |
| 5,561,604 A | 10/1996 | Buckley et al. |
| 5,572,005 A | 11/1996 | Hamilton et al. |
| 5,583,965 A | 12/1996 | Douma et al. |
| 5,584,054 A | 12/1996 | Tyneski et al. |
| 5,587,735 A | 12/1996 | Ishida et al. |
| 5,619,270 A * | 4/1997 | Demmer ...................... 348/441 |
| 5,619,684 A | 4/1997 | Goodwin et al. |
| 5,644,628 A | 7/1997 | Schwarzer et al. |
| 5,666,299 A * | 9/1997 | Adams et al. ............... 708/300 |
| 5,671,267 A | 9/1997 | August et al. |
| 5,682,195 A | 10/1997 | Hendricks et al. |
| 5,684,918 A | 11/1997 | Abecassis |
| 5,917,735 A * | 6/1999 | Ko .............................. 708/313 |
| 6,000,834 A * | 12/1999 | Duan ........................ 708/313 |
| 6,084,916 A * | 7/2000 | Ott .............................. 375/259 |

* cited by examiner

*Primary Examiner*—Hassan Kizou
*Assistant Examiner*—Ahmed Elallam

(57) ABSTRACT

A digital channelizer employs a polyphase filter element in which a shift register is used to commutate time series data to a bank of polyphase filters at the inputs of an FFT module. The filter bank and FFT module are updated at a frequency that is independent of the rate that the data is fed into the buffer and filter/FFT cycle rates of less than the ratio of the input data rate to the number of input channels may be accommodated by the shift register commutation. The output of the FFT module is interpolation filtered by inserting interpolated points between adjacent data points in the channelized output stream to increase the output frequency by an integral multiple of the update rate of the polyphase filter/FFT update rate. By determining an integer, q, such that $(R_o/R_i)(2N-q)$ is a non-zero integer l, where $R_o$ is a desired output data rate, $R_i$ is an input data rate and 2N is the number of output channels (M<N), updating the filter/FFT at a rate of $R_i/(2N-q)$, and interpolation filtering by inserting l-1 interpolated data between each successive pair of channelized data, a desired output data rate can be matched with an input data rate.

26 Claims, 6 Drawing Sheets

SPECTRUM OF DIGITAL DATA

FIG. 3

REGISTERS OF DATA VALUES

| | 1 | 2 | 3 | 4 | 5 |
|---|---|---|---|---|---|
| $x(n)$ | n 0 | n −14 | n −28 | n −42 | n −56 |
| | n −1 | n −15 | n −29 | n −43 | n −57 |
| | n −2 | n −16 | n −30 | n −44 | n −58 |
| | n −3 | n −17 | n −31 | n −45 | n −59 |
| | n −4 | n −18 | n −32 | n −46 | n −60 |
| | n −5 | n −19 | n −33 | n −47 | n −61 |
| | n −6 | n −20 | n −34 | n −48 | n −62 |
| | n −7 | n −21 | n −35 | n −49 | n −63 |
| | n −8 | n −22 | n −36 | n −50 | n −64 |
| | n −9 | n −23 | n −37 | n −51 | n −65 |
| | n −10 | n −24 | n −38 | n −52 | n −66 |
| | n −11 | n −25 | n −39 | n −53 | n −67 |
| | n −12 | n −26 | n −40 | n −54 | n −68 |
| | n −13 | n −27 | n −41 | n −55 | n −69 |

FILTERS

| 1 | 2 | 3 | 4 | 5 |
|---|---|---|---|---|
| h( 0 ) | h( 14 ) | h( 28 ) | h( 42 ) | h( 56 ) |
| h( 1 ) | h( 15 ) | h( 29 ) | h( 43 ) | h( 57 ) |
| h( 2 ) | h( 16 ) | h( 30 ) | h( 44 ) | h( 58 ) |
| h( 3 ) | h( 17 ) | h( 31 ) | h( 45 ) | h( 59 ) |
| h( 4 ) | h( 18 ) | h( 32 ) | h( 46 ) | h( 60 ) |
| h( 5 ) | h( 19 ) | h( 33 ) | h( 47 ) | h( 61 ) |
| h( 6 ) | h( 20 ) | h( 34 ) | h( 48 ) | h( 62 ) |
| h( 7 ) | h( 21 ) | h( 35 ) | h( 49 ) | h( 63 ) |
| h( 8 ) | h( 22 ) | h( 36 ) | h( 50 ) | h( 64 ) |
| h( 9 ) | h( 23 ) | h( 37 ) | h( 51 ) | h( 65 ) |
| h( 10 ) | h( 24 ) | h( 38 ) | h( 52 ) | h( 66 ) |
| h( 11 ) | h( 25 ) | h( 39 ) | h( 53 ) | h( 67 ) |
| h( 12 ) | h( 26 ) | h( 40 ) | h( 54 ) | h( 68 ) |
| h( 13 ) | h( 27 ) | h( 41 ) | h( 55 ) | h( 69 ) |

FIG. 4

| REGISTERS OF DATA VALUES | | | | | | FILTERS | | | | |
|---|---|---|---|---|---|---|---|---|---|---|
| 1 | 2 | 3 | 4 | 5 | | 1 | 2 | 3 | 4 | 5 | x(n)

| 1 | 2 | 3 | 4 | 5 |
|---|---|---|---|---|
| n +14 | n 0 | n −14 | n −28 | n −42 |
| n +13 | n −1 | n −15 | n −29 | n −43 |
| n +12 | n −2 | n −16 | n −30 | n −44 |
| n +11 | n −3 | n −17 | n −31 | n −45 |
| n +10 | n −4 | n −18 | n −32 | n −46 |
| n +9 | n −5 | n −19 | n −33 | n −47 |
| n +8 | n −6 | n −20 | n −34 | n −48 |
| n +7 | n −7 | n −21 | n −35 | n −49 |
| n +6 | n −8 | n −22 | n −36 | n −50 |
| n +5 | n −9 | n −23 | n −37 | n −51 |
| n +4 | n −10 | n −24 | n −38 | n −52 |
| n +3 | n −11 | n −25 | n −39 | n −53 |
| n +2 | n −12 | n −26 | n −40 | n −54 |
| n +1 | n −13 | n −27 | n −41 | n −55 |

| 1 | 2 | 3 | 4 | 5 |
|---|---|---|---|---|
| h( 0) | h( 14) | h( 28) | h( 42) | h( 56) |
| h( 1) | h( 15) | h( 29) | h( 43) | h( 57) |
| h( 2) | h( 16) | h( 30) | h( 44) | h( 58) |
| h( 3) | h( 17) | h( 31) | h( 45) | h( 59) |
| h( 4) | h( 18) | h( 32) | h( 46) | h( 60) |
| h( 5) | h( 19) | h( 33) | h( 47) | h( 61) |
| h( 6) | h( 20) | h( 34) | h( 48) | h( 62) |
| h( 7) | h( 21) | h( 35) | h( 49) | h( 63) |
| h( 8) | h( 22) | h( 36) | h( 50) | h( 64) |
| h( 9) | h( 23) | h( 37) | h( 51) | h( 65) |
| h( 10) | h( 24) | h( 38) | h( 52) | h( 66) |
| h( 11) | h( 25) | h( 39) | h( 53) | h( 67) |
| h( 12) | h( 26) | h( 40) | h( 54) | h( 68) |
| h( 13) | h( 27) | h( 41) | h( 55) | h( 69) |

FIG. 7

REGISTERS OF DATA VALUES

|  | 1 | 2 | 3 | 4 | 5 |
|---|---|---|---|---|---|
| x(n) | n +12 | n −2 | n −16 | n −30 | n −44 |
|  | n +11 | n −3 | n −17 | n −31 | n −45 |
|  | n +10 | n −4 | n −18 | n −32 | n −46 |
|  | n +9 | n −5 | n −19 | n −33 | n −47 |
|  | n +8 | n −6 | n −20 | n −34 | n −48 |
|  | n +7 | n −7 | n −21 | n −35 | n −49 |
|  | n +6 | n −8 | n −22 | n −36 | n −50 |
|  | n +5 | n −9 | n −23 | n −37 | n −51 |
|  | n +4 | n −10 | n −24 | n −38 | n −52 |
|  | n +3 | n −11 | n −25 | n −39 | n −53 |
|  | n +2 | n −12 | n −26 | n −40 | n −54 |
|  | n +1 | n −13 | n −27 | n −41 | n −55 |
|  | n +0 | n −14 | n −28 | n −42 | n −56 |
|  | n −1 | n −15 | n −29 | n −43 | n −57 |

FILTERS

| 1 | 2 | 3 | 4 | 5 |
|---|---|---|---|---|
| h( 0) | h( 14) | h( 28) | h( 42) | h( 56) |
| h( 1) | h( 15) | h( 29) | h( 43) | h( 57) |
| h( 2) | h( 16) | h( 30) | h( 44) | h( 58) |
| h( 3) | h( 17) | h( 31) | h( 45) | h( 59) |
| h( 4) | h( 18) | h( 32) | h( 46) | h( 60) |
| h( 5) | h( 19) | h( 33) | h( 47) | h( 61) |
| h( 6) | h( 20) | h( 34) | h( 48) | h( 62) |
| h( 7) | h( 21) | h( 35) | h( 49) | h( 63) |
| h( 8) | h( 22) | h( 36) | h( 50) | h( 64) |
| h( 9) | h( 23) | h( 37) | h( 51) | h( 65) |
| h( 10) | h( 24) | h( 38) | h( 52) | h( 66) |
| h( 11) | h( 25) | h( 39) | h( 53) | h( 67) |
| h( 12) | h( 26) | h( 40) | h( 54) | h( 68) |
| h( 13) | h( 27) | h( 41) | h( 55) | h( 69) |

DIGITAL CHANNELIZER WITH ARBITRARY OUTPUT SAMPLING FREQUENCY

TECHNICAL FIELD

The invention relates to channelizing a digital spectrum into frequency bands when the input Analog to Digital Converter (ADC) sampling rate is constrained to a given value and, a specific but arbitrary, output sampling rate is desired.

BACKGROUND OF THE INVENTION

Frequency Division Multiple Access (FDMA) provides access for multiple users to a single channel by subdividing the channel into multiple sub-channels. Each user is allocated one or a subset of all the channels and the user's signal is used to modulate a carrier of the allocated sub-channel. A single-channel receiver may be used to demodulate a single assigned channel, or a multichannel receiver may demodulate a selected range of channels.

In an analog system, each receiver has a local oscillator (LO) tuned to the frequency of the channel to be demodulated. The LO signal is multiplied by the received signal to generate an intermediate frequency (IF) signal that is applied to a band-pass filter (BPF). The BPF has a passband selected to filter out all signals except the channel to be received. The output signal from the BPF can be digitized and processed subsequently, if desired.

Referring to FIG. 1, a typical receiver 100 is shown with a local oscillator (LO) 105 of frequency $\omega$. A signal mixer 110 mixes the amplified incoming FDMA signal 106 with LO 105 output to produce a signal with a fixed intermediate frequency (IF) 107. An analog BPF 111 selects the desired channel and an analog-to-digital converter (ADC) 115 converts the resulting output to digital form by sampling the analog signal at an appropriate frequency. Generally, the sampling frequency is at least twice the channel bandwidth to satisfy the Nyquist requirement.

The sampled digital data, x(n), is bandshifted digitally by digital detector 116 by multiplying with a phasor $e^{-j2\pi(kn/N)}$ denoted by $W_N^{kn}$, where k denotes the channel selected by the receiver. When there are multiple channels contained in the received signal then one such receiver is needed for each of the channels. The resulting signal is low-pass filtered using a digital low pass filter 117. All of the processes following digitization of the band-passed IF signal can be performed with a digital computer or specialized circuits well known in the art.

Referring to FIG. 2, in a conventional polyphase approach to digital channelization, M channels of bandwidth B are received simultaneously in a FDMA signal 106. (Background on polyphase DSP can be found in R. E. Crochiere and L. E. Rabiner, *Multirate Digital Signal Processing*, Prentice Hall, Englewood Cliffs, N.J., 1983; and N. J. Fiege, *Multirate Digital Signal Processing*, John Wiley & Sons, 1994; the entire contents of each of which is incorporated herein by reference.) After M channels, each of bandwidth B, are passed through an analog BPF having a passband of at least MB (not shown) they are output to an A/D converter 140 which samples at some rate that is at least equal to the Nyquist rate (2MB) for a signal of bandwidth MB. In FIG. 2, the data is sampled at 2NB where N is greater than or equal to M. The digital output x(n) is applied to a 2N pole commutator 141 which distributes the input data x(n) to 2N filters 150. Each filter 150 is updated once every 2N points. Filters 150 perform the channel extraction function.

The time series output of filters 150 is applied to respective inputs of an FFT processor 160 which processes the data once every 2N points to produce 2N complex outputs of which M outputs are chosen, each representing the band-shifted subchannel signal at B Hz, the update rate of FFT processor 160. Only M outputs of FFT processor 160 are required since the sample rate 2NB, as mentioned, can be higher than the minimum required sample rate 2MB.

The prior art approach cannot effectively accommodate signal processing subsequent to FFT processing that requires a sample rate that is independent of the sample rate of the A/D converter.

BRIEF DESCRIPTION OF THE DRAWINGS

In the drawing,

FIG. 3 illustrates register and filter states at a first time of a shift register buffer and mask filter of an embodiment of the invention.

FIG. 4 illustrates register and filter states at a later time of a shift register buffer and mask filter of an embodiment of the invention.

FIG. 7 illustrates register and filter states at the later time of FIG. 4 of the shift register buffer and mask filter of another embodiment of the invention.

SUMMARY OF THE INVENTION

Figure 1:
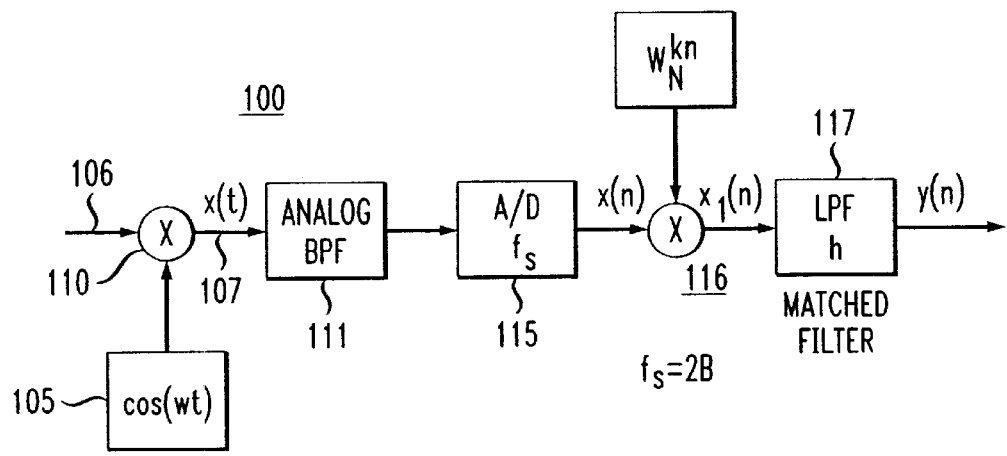
FIG. 1 illustrates a receiver according to the prior art.

Briefly, a digital channelizer employs a polyphase filter element in which a shift register is used to commutate time series data to a bank of polyphase filters at the inputs of an FFT module. The filter bank and FFT module are updated at a frequency that is independent of the rate that data is fed into the buffer. The output of the FFT module is interpolation-filtered by inserting interpolated points between adjacent data points in the channelized output stream to increase the output frequency to an integral multiple of the update rate of the polyphase filter/FFT update rate. By determining an integer, q, the overlap number of samples, such that $(R_o/R_i)(2N-q)$ is a non-zero integer l, where $R_o$ is a desired output data rate, $R_i$ is an input data rate, updating the filter/FFT at a rate of $R_i/(2N-q)$, and interpolation filtering by inserting l-1 interpolated data between each successive pair of channelized data, the invention allows a desired output data rate to be obtained from a given input data rate.

A preferred embodiment of the invention extracts individual channels from a received FDMA signal by digitally processing the signal after A/D converting at an appropriate sampling frequency while allowing data to be supplied for subsequent processing at some other frequency, unrelated to A/D converter sampling frequency. This allows the output sample rate to be arbitrarily chosen suitable to the subsequent processing and not constrained by the input sampling frequency. The approach allows a channelization function for FDMA systems to be shared between analog and digital hardware elements resulting in a less analog hardware and, in most cases, reduced overall digital processing load.

The invention performs a sequence of operations that result in the digital channelizing of an input data stream at one rate to obtain a specific output sampling frequency by the application of an interpolation function at the output of the channelizer. The preferred embodiment of the invention (1) bandshifts the input FDMA RF signal, through combination with the output of a local oscillator, to a specific intermediate frequency (IF). The IF signal is (2) band pass filtered using an anti-aliasing BPF of the channel bandwidth. The band-pass filtered signal is (3) sampled with an ADC at an appropriate sampling rate and digitally (4) filtered with a bank of multi-rate poly-phase filters. The FFT output is then (5) interpolation filtered by inserting interpolated data into the channelized output using selected parameters to obtain a sample sequence at the desired sampling frequency. The process of obtaining the IF signal is a conventional process performed by a receiver. The process involved in the poly-phase filtering, steps 3 through 5 is applicable to any problem that requires frequency band channelization and more generally, to any filtering step requiring block-interleaving.

The invention efficiently performs channel separation for FDMA signals by sharing the channel separation function between analog and digital hardware. The invention permits subsequent digital processing to employ an arbitrary sampling rate relative to the sampling rate of FDMA separation. A poly-phase structure is employed to channelize the digitized FDMA signal into individual bands.

In a multichannel system, depending upon the availability of high-speed analog-to-digital converters ADCs, the sub-channel bandwidth, and the number of combined channels in the FDMA signal, it may be advantageous to share the channelization function between analog and digital signal-processing hardware. Such a scheme requires that a high-frequency signal be sampled at some rate that satisfies the Nyquist requirement. The techniques employed in the invention permit the sharing of the channelization between analog and digital hardware and adds to the channelization function, an update rate selection and interpolation function that allows any arbitrary output sample rate that may be dictated by the requirements of the subsequent digital signal processing, independent of the input sampling frequency.

In an embodiment of the invention, a signal conditioning apparatus receives primary data from a data source at a primary sample rate and outputs final data at a final sample rate. A data buffer receives the primary data sequentially from the data source and outputs buffered data in sequential blocks. A block filter receives the buffered data block and performs an operation (for example, filter and FFT) to generate block output result which is applied to an interpolation filter that inserts interpolated data between the adjacent points in each resulting parallel stream of data. The block filter permits input to the block filter, blocks with overlapping portions of selectable size, so that the block operation can be performed at a selected rate independent of the ratio of the size of the blocks and primary sample rate to allow a desired output rate to be obtained when the input sample rate is fixed.

In another embodiment, the block filter has a controller connected that controls the degree of overlap q between successive blocks input to the block filter. The controller is programmed to control the degree of overlap such that said final sample rate is an integral multiple of a ratio of the selected input rate and a size of the blocks (2N−q).

In still another embodiment, the rate of update of the block is variable relative to the rate of input of data from the data source so that any input and output data rates can be accommodated. The controller would control the rate of insertion of interpolated data by the interpolation filter such that said final sample rate is an integral multiple of a ratio of the input rate and the size of the data blocks for each channel.

In another embodiment, the invention includes a method of controlling a signal conditioning apparatus receiving primary data from a data source at a primary sample rate, performing a block operation on a block of the primary data input to a block filter, and outputting final data at a final sample rate. According to the method the primary data is buffered to form blocks of the primary data. The blocks are outputted to the block filter at a block update rate. The block operation is performed on the blocks to form output blocks. Data is inserted in the output blocks at an insertion rate that is a non-integral multiple of the primary sample rate.

In another embodiment, the block update rate is such that each of the blocks contains at least one datum overlapping at least one datum in a successive block, so that the block update rate is less than a ratio of the primary sample rate and the size of the blocks.

In still another embodiment, the invention includes a method of separating the combined signals in a frequency division multiple access (FDMA) signal. The method includes the following steps. Digitizing the FDMA signal at a primary sample rate to produce a primary data stream; Buffering the primary data stream to output the primary data stream in blocks at a block-generation rate, each of the blocks being of size 2N and the block generation rate being equal to the ratio of said primary sample rate and (2N−q), where q is an integer number of overlap samples; Digital-Fourier-transforming said blocks at the block generation rate to produce multiple channel signal streams; and inserting interpolated data in the multiple channel signal streams to produce final multiple channel signal streams at a desired sample rate.

DETAILED DESCRIPTION OF THE EMBODIMENTS

Figure 2:
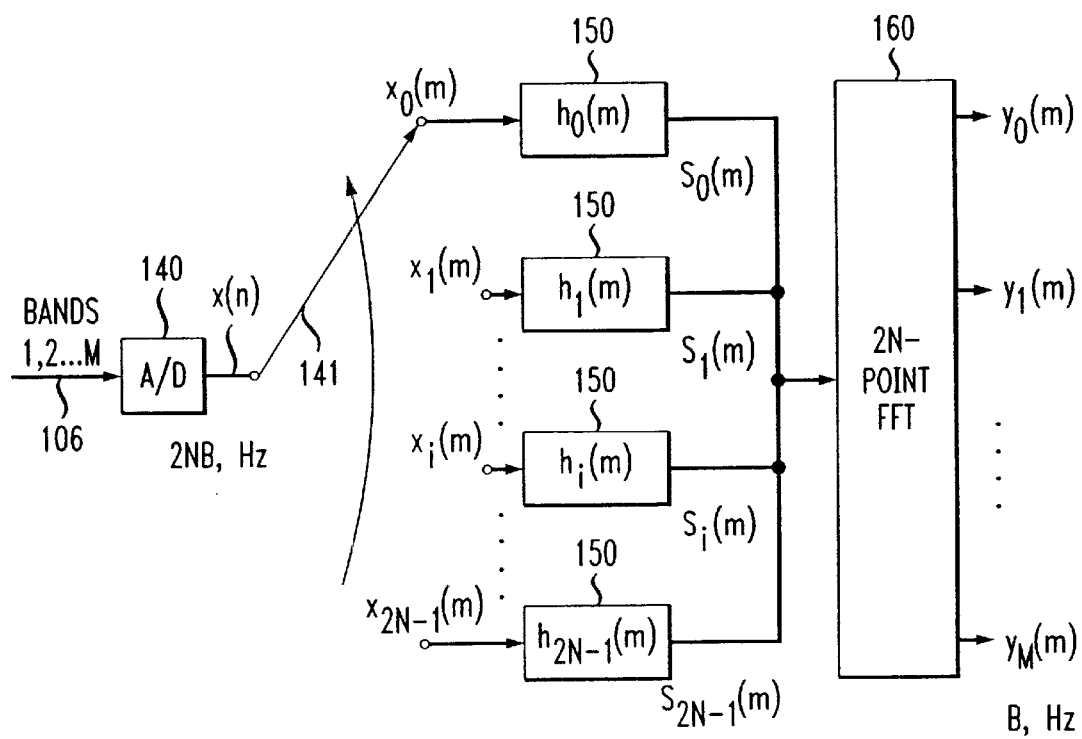
FIG. 2 illustrates a polyphase channelizer according to the prior art.
Figure 5:
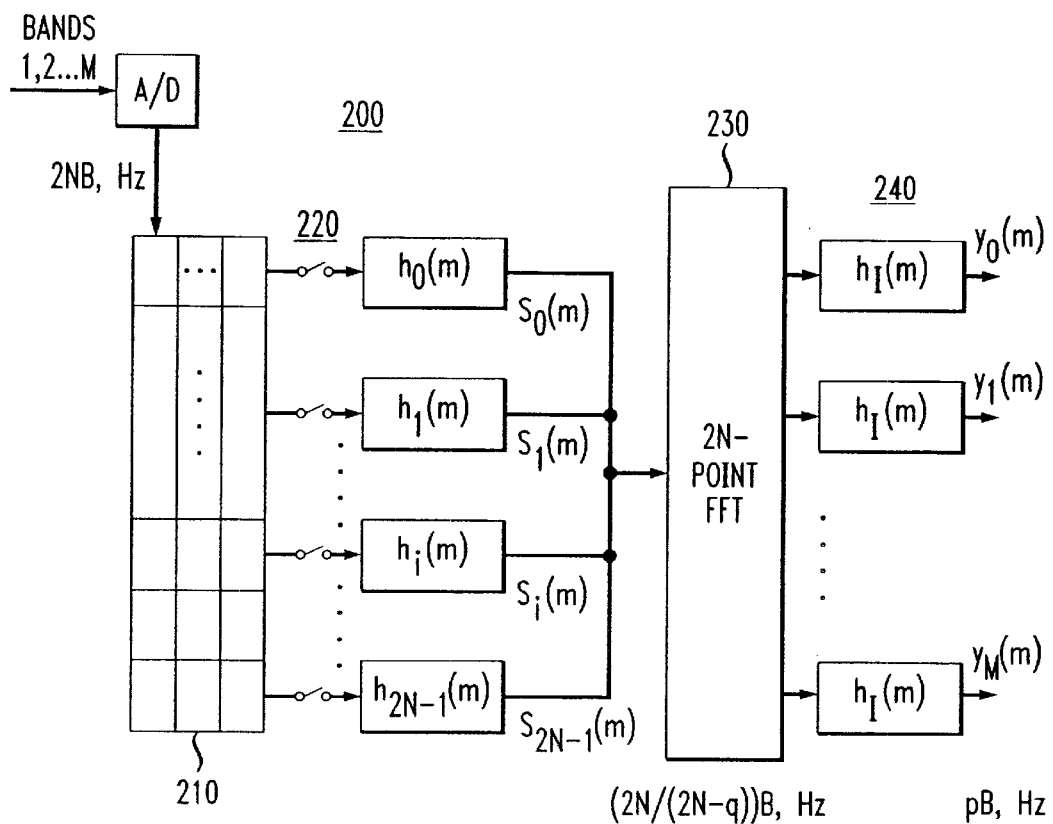
FIG. 5 illustrates a channelizer according to an embodiment of the invention.

Referring to FIG. 5, a polyphase channelizer 200 according to an embodiment of the invention employs a shift register 210 to distribute the time series data over input channels 220 to an FFT block 230 instead of the commutator 141 of the device of FIG. 2. Referring now also to FIGS. 3 and 4, the contents of filter registers denoted $h_i(m)$ and corresponding data registers corresponding to the polyphase system of FIG. 5 are represented as a chart with the condition of the registers at a certain point in time and the condition of the registers after 2N additional points have been sampled. In a conventional poly-phase application, the data registers would be shifted by exactly the size of the following FFT, that is, by the number of input channels. Thus, if the FFT has 2N inputs, the 2N data points would be distributed by the shift register and the FFT invoked. FIG. 3 shows the contents of an example in which the FFT is of size 2N=14 and FIG. 4 shows the contents 2N=14 samples later (equivalent to one sweep of the commutator 141).

Figure 6:
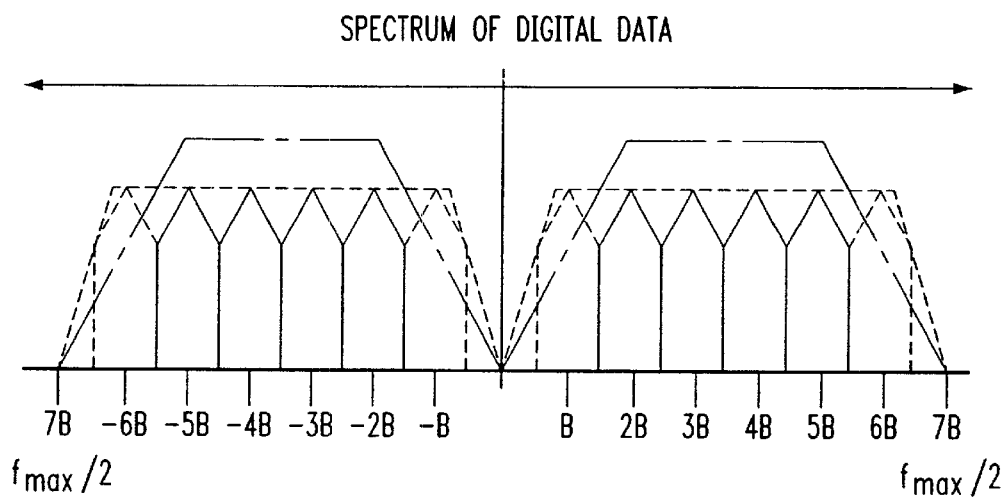
FIG. 6 illustrates a spectrum of a multiple frequency channel signal according to an embodiment of the invention.

Referring to FIG. 6, the spectrum of an example data set with 4 or 6 frequency bands that need to be separated digitally is shown. The dashed lines show the ideal spectral response of analog band pass filtering typically employed to filter the analog signal prior to digitizing. The short-long dashed line shows the spectral response of a less ideal BPF with a slower cutoff rate.

Referring again to FIG. 5, a series of polyphase filters $h_i(m)$ are employed. Each filter is formed by taking every $\frac{1}{2}N^{th}$ point of a low pass filter finite-impulse-response (FIR) that would ordinarily be needed to extract one band of width B from the input data sample at 2NB. If a P tap FIR is required to meet the channel separation specification, then each of the polyphase filters $h_i(m)$ consists of P/2N taps. Shift register buffer 210 distributes the input data to the 2N digital filters $h_i(m)$, one for each input to FFT module. In the device of FIG. 5, the input data applied to FFT module 230, a block of data, passes through the poly-phase filters $h_i(m)$ at a relatively low rate. The rate of output of the data outputted by the FFT block 230 is subsequently increased by the application of an interpolation filter bank which inserts interpolated data. The data from shift register buffer 210 can be input to the polyphase filters $h_i(m)$ at a selected rate. The outputs of the filters are input to an FFT module 230 to produce the channelized digital signals. The output digital signals $y_i(m)$ pass through appropriately-selected interpolation filters $h_{INT}(m)$ 240. As explained below, a desired arbitrary output sampling rate is obtained by appropriate choice of the filter/FFT update rate and an interpolation factor applied to the output.

In a poly-phase system, the input data distributor (shift register buffer 210 of FIG. 5), distributes time series data to a bank of polyphase filters $H_i(m)$. FIG. 5 shows a situation where an FDMA signal is to be resolved into M frequency channels, each of bandwidth B. The channels are contained in real input data that is sampled at a frequency 2NB. The positive and negative frequency components of the real data are assumed to exist over the following frequency ranges:

$$\left[\frac{N-M}{2}\right] \cdot B - \left[\frac{N+M}{2}\right] \cdot B \text{ and } \left[\frac{N-M}{2}\right] \cdot B - \left[\frac{N+M}{2}\right] \cdot B \quad (1)$$

where the choice of N satisfies the Nyquist criterion by providing that $N \geq M$. In the situation depicted in FIG. 6, N=7 and the sampling frequency is 14B. Signals containing either four (M=4) or six (M=6) channels each of bandwidth B are shown. The selection of N−M depends upon the desired transition bandwidth $$\left[\frac{N-M}{2}\right]$$

of the anti-aliasing filters whose spectra are shown as dashed lines. Also, for subsequent computational efficiency in the application of the poly-phase structure, the bands are centered at multiples of B. The polyphase system can be applied to data sampled in this fashion so that M output channels of the FFT block are selected and the remaining channels are not used.

In general, an input data rate of 2NB Hz, distributing data to 2N filters results in an FFT complex output generated at the minimum Nyquist rate of B Hz. This is because the FFT block is updated, as discussed above, once for every 2N points fed into the shift register buffer. Often, however, it is necessary to generate an output signal with a sample rate dictated by subsequent digital processing that is completely independent of the rate at which samples are supplied to the FFT block. In such a situation, the conventional application of the poly-phase structure will not necessarily be capable of yielding the desired output rate from the FFT block.

According to the invention, a higher output rate of pB, such that (2N/p) is a non-zero integer, is obtained by updating the filter and FFT block once every (2N−q) samples, instead of once every 2N samples. In the following technique the filter/FFT block is updated at one rate and a subsequent interpolation step is used to increase the sampling frequency to the desired value of pB. The algorithm consists of updating the filter/FFT block once every (2N−q) samples by choosing q such that the FFT output sampling frequency becomes [2NB/(2N−q)], that can be increased to pB by interpolation of the output of the FFT block. To be able to interpolate an integer number of samples between each pair of samples output from the filter/FFT block, q must be chosen such that $$l = \left[p \cdot \frac{2 \cdot N - q}{2 \cdot N}\right]$$

is a non-zero integer. When this condition is satisfied, (l−1) interpolated points can be inserted between each pair of filter/FFT block outputs to obtain the desired output rate of pB.

Interpolation may be performed by the conventional method of inserting (l−1) zeros between each pair of points and low pass filtering the zero-inserted sample stream through an interpolation filter k(n) to eliminate the spectral copies generated by the zero-insertion.

A specific example of an application of the invention is now described. Consider a case where 6 channels, each of bandwidth B, are to be extracted from a sampled data stream that is sampled at the sampling frequency of 14B. This case is shown in FIG. 6 (along with another case for M=4 that would be compatible with an anti-aliasing filter with a wider transition band width). In the example case, M=6 and N=7 and the transition bandwidth of the anti-aliasing filter is equal to B/2. Consider a signal processing application that requires an input sample rate of 3.5B, that must be generated by the output of the digital channelizer. As discussed, in the convention poly-phase system a bank of 14 sub-band filters followed by a 14-point FFT block outputting complex data at the rate of B (the update rate of the FFT block) will be employed. According to the invention, the FFT block is updated at a different rate. To obtain an output-rate of 3.5B, q must be chosen such that, $$l = \left[p \cdot \frac{2 \cdot N - q}{2 \cdot N}\right] = \left[3.5 \cdot \frac{14 - q}{14}\right] = \left[\frac{14 - q}{4}\right]$$

is a non-zero integer. A choice of q=2, 6, or 10 would make l an integer. The smallest value of q results in the smallest number of computations as the filter FFT block is updated less frequently. Choosing q=2, requires the filter/FFT block to be updated every 12 points so that the FFT update rate becomes $$\frac{14}{12} \cdot B = \frac{7}{6}.$$

FIG. 3 shows a schematic of the input data and filter registers for this example. FIG. 7 shows the example with the input data stream at the next FFT update interval occurring 12 input samples later.

Referring to FIG. 7 the condition of the shift register buffer at the beginning of the next FFT update cycle, the state at beginning of the prior state being shown in FIG. 3. Here the rate of update of the FFT module is less than the cycle rate of commutation instead of equal to it as in the usual operation. The change from FIG. 3 to FIG. 4 represents an update rate of once every 14 samples. The change from FIG. 3 to FIG. 7 represents an update rate of only once every 12 samples.

Figure 8:
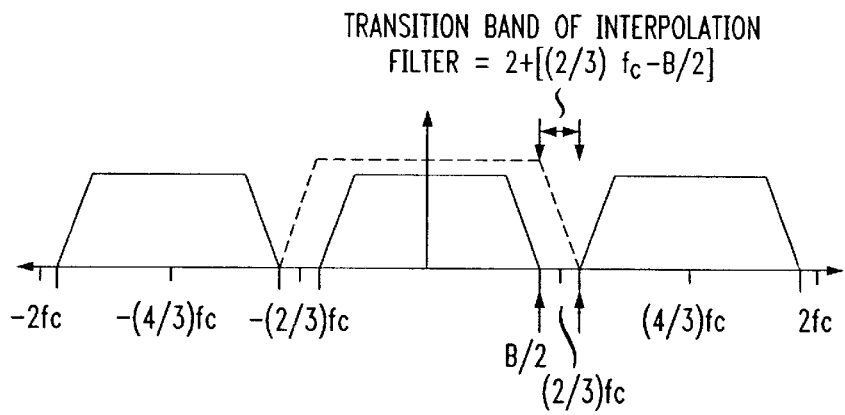
FIG. 8 illustrates the process of interpolating FFT-filtered data according to an embodiment of the invention.

Referring to FIG. 8 a signal is interpolated in a manner that is conceptually the same as adding an integer number of zeros between each successive pair of points to multiply the sample rate by that number plus 1. This procedure produces copies of the spectrum which can be removed by appropriately low-pass filtering the zero-packed series of data as depicted schematically in the FIG. 8.

The purpose of the device shown in FIG. 5 is to extract individual channels from a received analog FDMA signal (that is, one containing multiple frequency channels) by processing digitally after sampling the analog signal at an appropriate sampling frequency. As also shown in FIG. 5, the FFT-output data is interpolated and low-pass filtered by interpolation filters that can multiply the number of data points by an arbitrary integer. The apparatus allows the additional benefit to be achieved permitting the output to be supplied at any arbitrary desired sampling rate by adherence to certain rules which are discussed below. These advantages are achieved efficiently with minimal digital signal processing.

Interpolating two points between each pair of points will increase the output rate by a factor of 3 to the desired rate of 3.5B. FIG. 8 shows the spectrum of the output of the FFT block after filtering, which effectively adds two zeros between each pair of adjacent points. The copies of the spectrum that appear at $(4/3)f_c$ where $f_c$ is the cutoff frequency, are removed by the interpolation filter bank 240 shown in FIG. 5, whose spectrum is shown by the dotted line in FIG. 8.

Figure 9:
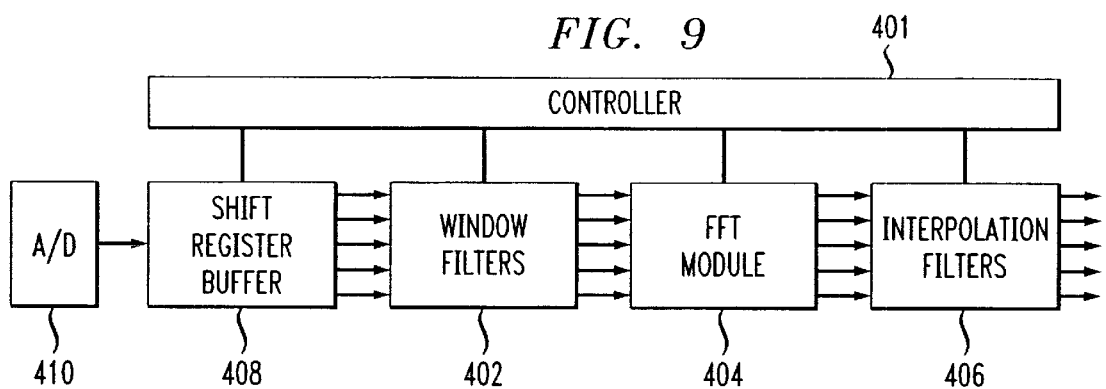
FIG. 9 illustrates a controller for the embodiment of FIG. 5.
Figure 10:
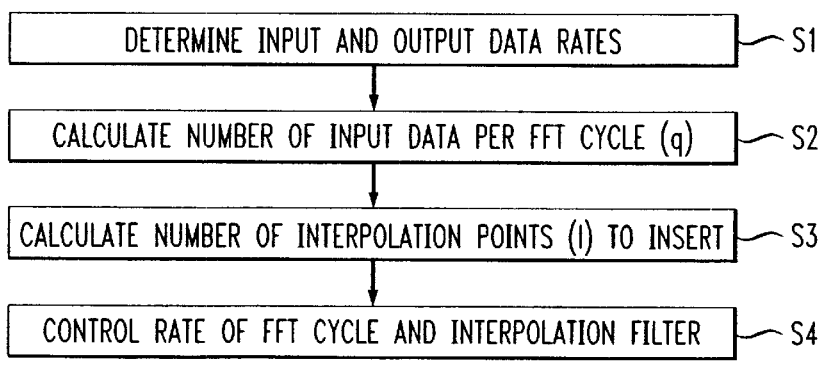
FIG. 10 illustrates a control procedure of the controller of FIG. 9.

Referring to FIG. 9, the above technique for matching independent input and output data rates can be used as a basis of design or implemented in a control program to control the various elements of a polyphase filter according to the invention. Thus, for example, a programmable controller 401 is programmed to implement the techniques discussed above to control the rate of update of window filters 402 and FFT module 404 as well as interpolation filters 406. Referring now also to FIG. 10, controller 401 determines input and output data rate requirements in a first step S1. Controller 401 then calculates the values of q and l as discussed above to determine the number of input samples per cycle of the filter/FFT block and the number of interpolated data to insert in steps S2 and S3, respectively. Then controller 401 controls window filters 402, shift register buffer 408, FFT module 404, and interpolation filters 406 accordingly.

The following applications, filed concurrently herewith, are hereby incorporated by reference:

1. A Hybrid Fiber Twisted-pair Local Loop Network Service Architecture, U.S. patent application Ser. No. 09/001,360, filed Dec. 31, 1997;
2. Dynamic Bandwidth Allocation for use in the Hybrid Fiber Twisted-pair Local Loop Network Service Architecture, U.S. patent application Ser. No. 09/001,425, filed Dec. 31, 1997;
3. The VideoPhone, U.S. patent application Ser. No. 09/001,905, filed Dec. 31, 1997;
4. VideoPhone Privacy Activator (Gerszberg 44-10-3);
5. VideoPhone Form Factor, U.S. patent application Ser. No. 09/001,583, filed Dec. 31, 1997;
6. VideoPhone Centrally Controlled User Interface With User Selectable Options, U.S. patent application Ser. No. 09/001,576, filed Dec. 21, 1997;
7. VideoPhone User Interface Having Multiple Menu Hierarchies, U.S. patent application Ser. No. 09/001,908, filed Dec. 31, 1997;
8. VideoPhone Blocker, U.S. patent application Ser. No. 09/001,353, filed Dec. 31, 1997;
9. VideoPhone Inter-com For Extension Phones, U.S. patent application Ser. No. 09/001,358, filed Dec. 31, 1997;
10. Advertising Screen Saver, U.S. patent application Ser. No. 09/001,574, filed Dec. 31, 1997, and issued as U.S. Pat. No. 6,084,583 on Jul. 4, 2000;
11. VideoPhone FlexiView Advertising, U.S. patent application Ser. No. 09/001,574, filed Dec. 31, 1997;
12. VideoPhone Multimedia Announcement Answering Machine, U.S. patent application Ser. No. 09/001,911, filed Dec. 31, 1997;
13. VideoPhone Multimedia Announcement Message Toolkit, U.S. patent application Ser. No. 09/001,345, filed Dec. 31, 1997;
14. VideoPhone Multimedia Video Message Reception, U.S. patent application Ser. No. 09/001,362, filed Dec. 31, 1997;
15. VideoPhone Multimedia Interactive Corporate Menu Answering Machine Announcement, U.S. patent application Ser. No. 09/001,574, filed Dec. 31, 1997;
16. VideoPhone Multimedia Interactive On-Hold Information Menus, U.S. patent application Ser. No. 09/001,356, filed Dec. 31, 1997, and issued as U.S. Pat. No. 6,020,916 on Feb. 1, 2000;
17. VideoPhone Advertisement When Calling Video Non-enabled VideoPhone Users, U.S. patent application Ser. No. 09/001,361, filed Dec. 31, 1997;
18. Motion Detection Advertising, U.S. patent application Ser. No. 09/001,355, filed Dec. 31, 1997;
19. Interactive Commercials, U.S. patent application Ser. No. 09/001,578, filed Dec. 31, 1997, and issued as U.S. Pat. No. 6,178,446 on Jan. 23, 2001;
20. VideoPhone Communication Device Providing In-home Catalog Services, U.S. patent application Ser. No. 09/001,421, filed Dec. 31, 1997;
21. A Facilities Management Platform For Hybrid Fiber Twisted-pair Local Loop Network, Service Architecture, U.S. patent application Ser. No. 09/001,422, filed Dec. 31, 1997;
22. Life Line Support for Multiple Service Access on Single Twisted-pair, U.S. patent application Ser. No. 09/001,343, filed Dec. 31, 1997;
23. A Network Server Platform (NSP) For a Hybrid Fiber Twisted-pair (HFTP) Local Loop Network Service Architecture, U.S. patent application Ser. No. 09/001,582, filed Dec. 31, 1997;
24. A Communication Server Apparatus For Interactive Commercial Service, U.S. patent application Ser. No. 09/001,344, filed Dec. 31, 1997;
25. NSP Multicast, PPV Server NSP Based Multicast Digital Program Delivery Services, U.S. patent application Ser. No. 09/001,580, filed Dec. 31,1997;
26. NSP Internet, JAVA Server and VideoPhone Application Server, U.S. patent application Ser. No. 09/001,354, filed Dec. 31, 1997, and issued as U.S. Pat. No. 6,044,403 on Mar. 28, 2000;
27. NSP WAN Interconnectivity Services for Corporate Telecommuters Telecommuting, U.S. patent application Ser. No. 09/001,540, filed Dec. 31, 1997;
28. NSP Telephone Directory White-Yellow Page Services, U.S. patent application Ser. No. 09/001,426, filed Dec. 31, 1997, and issued as U.S. Pat. No. 6,052,439 on Apr. 18, 2000;

29. NSP Integrated Billing System For NSP services and Telephone services, U.S. patent application Ser. No. 09/001,359, filed Dec. 31, 1997;
30. Network Server Platform/Facility Management Platform Caching Server, U.S. patent application Ser. No. 09/001,419, filed Dec. 31, 1997;
31. An Integrated Services Director (ISD) For Overall Architecture, U.S. patent application Ser. No. 09/001,417, filed Dec. 31, 1997;
32. ISD and VideoPhone Customer Premise Network, U.S. patent application Ser. No. 09/001,418, filed Dec. 31, 1997;
33. ISD Wireless Network, U.S. patent application Ser. No. 09/001,363, filed Dec. 31, 1997;
34. ISD Controlled Set-Top Box, U.S. patent application Ser. No. 09/001,424, filed Dec. 31, 1997;
35. Integrated Remote Control and Phone, U.S. patent application Ser. No. 09/001,423, filed Dec. 31, 1997;
36. Integrated Remote Control and Phone User Interface, U.S. patent application Ser. No. 09/001,420, filed Dec. 31, 1997;
37. Integrated Remote Control and Phone Form Factor, U.S. patent application Ser. No. 09/001,910, filed Dec. 31, 1997;
38. VideoPhone Mail Machine, U.S. provisional patent application Serial No. 06/070,014, filed Dec. 31, 1997;
39. Restaurant Ordering Via VideoPhone, U.S. provisional patent application Serial No. 60/070,121, filed Dec. 31, 1997;
40. Ticket Ordering Via VideoPhone, U.S. provisional patent application Serial No. 60/070,103, filed Dec. 31, 1997;
41. Multi-Channel Parallel/Serial Concatenated Convolutional Codes And Trellis Coded Modulation Encode/Decoder, U.S. patent application Ser. No. 09/001,342, filed Dec. 31, 1997;
42. Spread Spectrum Bit Allocation Algorithm, U.S. patent application Ser. No. 09/001,842, filed Dec. 31, 1997;
43. Digital Channelizer With Arbitrary Output Frequency, U.S. patent application Ser. No. 09/001,842, filed Dec. 31, 1997;
44. Method And Apparatus For Allocating Data Via Discrete Multiple Tones, U.S. patent application Ser. No. 08/997,167, filed Dec. 23, 1997, and issued as U.S. Pat. No. 6,134,274 on Oct. 17, 2000;
45. Method And Apparatus For Reducing Near-End Cross Talk In Discrete Multi-Tone Modulators/Demodulators, U.S. patent application Ser. No. 08/997,176, filed Dec. 31, 1997.

The present application is listed above at #43.

We claim:

1. A signal conditioning apparatus receiving primary data from a data source at a primary sample rate and outputting final data at a final sample rate, comprising:
   a data buffer connected to receive data sequentially from said data source and output buffered data in sequential blocks;
   a block filter, connected to receive said blocks, that generates block output data;
   a connection between said data buffer and said block filter permitting input to said block filter of blocks with overlapping portions of selectable size, such that said operation may be performed at a selected rate independent of the size of said blocks and said primary sample rate; and
   an interpolation filter connected to receive said block output data and configured to insert interpolated data into said block output data to generate said final data at said final sample rate.

2. A signal conditioning apparatus as in claim 1, further comprising:
   a controller connected to control said interpolation filter,
   said controller controlling said selectable size such that said final sample rate is an integral multiple of a product of said selected rate and a size of said blocks less said selectable size.

3. A signal conditioning apparatus as in claim 1, further comprising a controller connected to control a rate of insertion of said interpolated data by said interpolation filter such that said final sample rate is an integral multiple of a product of said selected rate and a size of said blocks less said selectable size.

4. A signal conditioning apparatus as in claim 1, wherein said buffer includes a shift register.

5. A signal conditioning apparatus as in claim 1, wherein said block filter is a computer programmed to calculate a spectra of a time series represented by said data blocks.

6. A method of controlling a signal conditioning apparatus receiving primary data from a data source at a primary sample rate and outputting final data at a final sample rate, the method comprising steps of:
   buffering said primary data to form blocks of said primary data;
   outputting said blocks of said primary data to a block filter at a block update rate;
   performing a block filter operation on said blocks of primary data to form output blocks;
   inserting interpolation data into said output blocks to form the final data having a final sample rate that is an integral multiple of said primary sample rate.

7. A method as in claim 6, wherein, in said step of outputting, said block update rate is such that each blocks of primary data contains at least one datum overlapping at least one datum in a successive block of primary data, whereby said block update rate is greater than a ratio of said primary sample rate and a size of said blocks of primary data.

8. A method as in claim 6, wherein said insertion rate is an integral multiple of said block update rate.

9. A method as in claim 6, wherein said step of performing the block filter operation includes calculating a fast Fourier transform of said blocks of primary data.

10. A method of separating the combined signals in a frequency division multiple access (FDMA) signal, comprising the steps of:
   digitizing said FDMA signal at a primary sample rate to produce a primary data stream;
   buffering said primary data stream to output said primary data stream in blocks at a block generation rate, each of said blocks being of size 2N, said block generation rate being equal to be a ratio of said primary sample rate and (2N−q), where q is an integer;
   digital-Fourier-transforming said blocks at said block generation rate to produce multiple channel signal streams;
   inserting interpolated data in said multiple channel signal streams at a rate equal to an integral multiple of said block generation rate to produce final multiple channel signal streams.

11. A method of controlling a polyphase filter having 2N input channels and a shift-register buffer to supply data received from a data source at a rate of $R_i$ to 2N inputs of a Fourier transform computer, said polyphase filter supplying channelized data to a data sink at a rate of $R_o$, comprising the steps of:

determining an integer, q, such that $(R_o/R_i)(2N-q)$ is a non-zero integer l;

commutatingly applying input data from said data source by shift-register buffering said input data laterally across B input channels of a Fourier transform computer;

Fourier transforming a result of said step of applying at a rate of $R_i/(2N-q)$ to generate channelized data; and inserting l–1 interpolated data between each successive pair of said channelized data.

12. A method as in claim 11, wherein q is the lowest non-zero integer such that $(R_o/R_i)(2N-q)$ is a non-zero integer l.

13. The method according to claim 11, wherein the step of inserting l–1 interpolated data inserts l–1 interpolated data between each successive pair of said channelized data so that $R_o$ is an integral multiple of a ratio of $R_i$ and $(2N-q)$.

14. A method of controlling a polyphase filter having 2N input channels and a shift-register buffer to supply data received from a data source at a rate of $R_i$, to 2N inputs of a Fourier transform computer, said polyphase filter supplying channelized data to a data sink at a rate of $R_o$, the method comprising steps of:

determining an integer value q such that $(R_o/R_i)(2N-q)$ is a non-zero integer l;

commutatingly applying input data from said data source by shift-register buffering said input data laterally across 2N input channels of the Fourier transform computer;

Fourier transforming a result of said step of applying at a rate of $R_i/(2N-q)$ to generate channelized data; and inserting l–1 interpolated data between each successive pair of said channelized data so that $R_o$ is an integral multiple of a ratio of $R_i$ and $(2N-q)$.

15. A method as in claim 14, wherein q is the lowest non-zero value such that $(R_O/R_1)(2N-q)$ is a non-zero interger l.

16. A signal channelizer, comprising:

a data buffer receiving data sequentially from a data source at an input sampling frequency, the data buffer outputting buffered data in sequential blocks, the sequential blocks of buffered data having overlapping portions of selectable size;

a block filter receiving the sequential blocks of buffered data at a selectable rate that is independent of a size of the sequential blocks of buffered data and independent of the input sampling frequency, the block filter generating block output data; and an interpolation filter inserting interpolated data into the block output data and generating an output having an output sampling frequency that is different from an input sampling frequency.

17. A signal channelizer as in claim 16, wherein said channelizer is a data channelizer.

18. A signal channelizer as in claim 17, wherein said channelizer is a frequency division multiple access signal channelizer.

19. A signal channelizer as in claim 16, wherein said data buffer is a shift register.

20. A signal channelizer as in claim 16, wherein the block filter includes a Fourier transform processor generating the block output data, the block output data being a bandshifted subchannel signal.

21. A signal channelizer as in claim 20, further comprising:

a controller connected to the interpolation filter and the block filter, the controller controlling the data size so that the output sampling frequency is an integral multiple of a product of a selected rate and a size of the sequential data blocks less the selectable size of overlap.

22. A method of transforming a first signal having a first sample rate to a plurality of second signals each having a second sample rate, the method comprising steps of:

receiving said first signal;

separating a first data stream derived from said first signal into a plurality of second data streams at a first data rate, the second data streams including sequential blocks of data having overlapping portions of selectable size;

converting said plurality of second data streams from said first data rate to a second data rate, the second data rate being independent of a size of the sequential blocks of data and the first sample rate; and inserting data in said plurality of second data streams to produce said plurality of second signals having said second sample rate, the second sample rate being different from said first sample rate.

23. A method as in claim 22, further comprising the step of:

filtering said plurality of second data streams with an interpolation filter to eliminate spectral copies.

24. A method as in claim 23, further comprising the step of:

digital-Fourier-transforming said plurality of second data streams.

25. A method as in claim 24, further comprising the step of:

polyphase filtering said plurality of second data streams.

26. A method as in claim 25, wherein said derivation of said first signal to said first data stream is digitizing said first signal at a first sample rate to produce said first data stream.

* * * * *